(12) United States Patent
Byers et al.

(10) Patent No.: US 7,805,276 B1
(45) Date of Patent: Sep. 28, 2010

(54) IMPACT DETECTION SYSTEM

(75) Inventors: Terry Byers, League City, TX (US);
Frank L. Gibbons, Houston, TX (US);
Eric L. Christiansen, Houston, TX (US)

(73) Assignee: The United States of America as represented by the Administrator of the National Aeronautics and Space Administration, Washington, DC (US)

(*) Notice: Subject to any disclaimer, the term of this patent is extended or adjusted under 35 U.S.C. 154(b) by 422 days.

(21) Appl. No.: 11/958,937

(22) Filed: Dec. 18, 2007

(51) Int. Cl.
*G01C 9/00* (2006.01)
*G01C 17/00* (2006.01)

(52) U.S. Cl. .................. 702/150; 702/35; 702/141; 702/149; 73/1.39; 73/583; 310/311; 310/334; 310/364; 473/454

(58) Field of Classification Search .............. 702/35, 702/141, 149, 150; 73/1.39, 583; 310/311, 310/334, 364; 473/454
See application file for complete search history.

(56) References Cited

U.S. PATENT DOCUMENTS

| | | |
|---|---|---|
| 2,944,250 A | 7/1960 | Outt |
| 4,770,527 A | 9/1988 | Park |
| 4,939,407 A | 7/1990 | Goo et al. |
| 4,975,616 A | 12/1990 | Park |
| 5,089,741 A | 2/1992 | Park et al. |
| 5,195,046 A | 3/1993 | Gerardi et al. |
| 5,447,315 A | 9/1995 | Perkins |
| 5,911,158 A | 6/1999 | Henderson et al. |
| 6,551,205 B1 * | 4/2003 | Koelzer et al. .............. 473/454 |
| 6,664,716 B2 | 12/2003 | Cuhat et al. |
| 6,700,314 B2 | 3/2004 | Cuhat et al. |
| 6,998,759 B2 | 2/2006 | Lee et al. |
| 2003/0001462 A1* | 1/2003 | Lee et al. .................. 310/365 |
| 2006/0053534 A1* | 3/2006 | Mullen .......................... 2/456 |

FOREIGN PATENT DOCUMENTS

| | | |
|---|---|---|
| JP | 62106334 A | 5/1987 |
| JP | 1223935 A | 9/1989 |

* cited by examiner

*Primary Examiner*—Sujoy K Kundu
(74) *Attorney, Agent, or Firm*—Theodore U. Ro

(57) ABSTRACT

In an embodiment, an apparatus and method capable of determining the time and location of a projectile's impact is disclosed. In another embodiment, an apparatus and method capable of determining the time and location of a projectile's impact as well as the direction from whence the projectile came is disclosed.

2 Claims, 6 Drawing Sheets

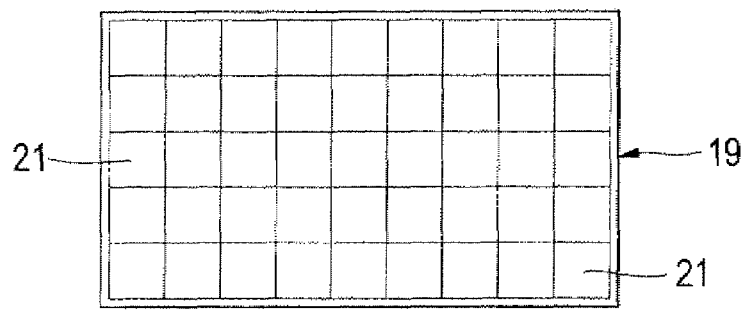
FIG. 3A
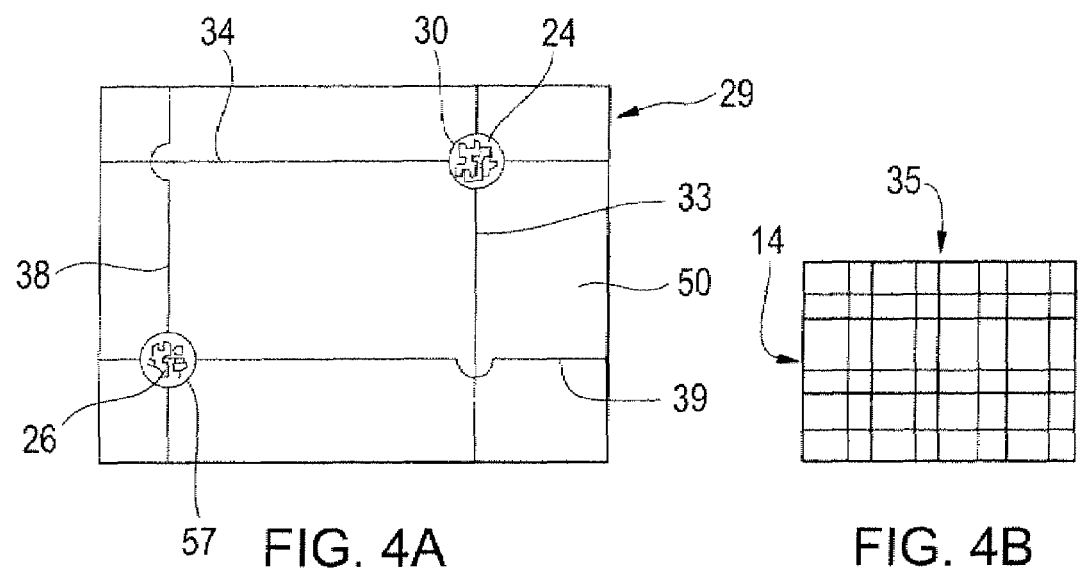
FIG. 4A
FIG. 4B

IMPACT DETECTION SYSTEM

ORIGIN OF THE INVENTION

The invention described herein was made in the performance of work under a NASA contract and is subject to the provisions of Section 305 of the National Aeronautics and Space Act of 1958, Public Law 85-568 (72 Stat. 435; 42 U.S.C. 2457).

BACKGROUND OF THE INVENTION

The present apparatus and methods for use relate generally to an impact detection system. More specifically, the present apparatus and methods for use relate to an impact detection system for use on a variety of different structures, such as for example: a spacecraft, aircraft, roof of a building, etc. Still more specifically, the present apparatus and methods for use relate to a system for measuring a physical force applied to a piezoelectric panel array coupled with a communications and control subsystem.

SUMMARY OF THE INVENTION

The present apparatus and methods for use is summarized as a plurality of piezoelectric panels configured in an array, whereby the array of panels are arranged in a cover assembly, and whereby the array of panels are coupled with a communications and control subsystem.

While the present apparatus and methods for use will be described in connection with presently described embodiments, it will be understood that it is not intended to limit the invention to those described embodiments. On the contrary, it is intended to cover all alternatives, modifications, and equivalents included within the spirit of the apparatus and methods for use and as defined in the appended claims.

BRIEF DESCRIPTION OF THE DRAWINGS

FIG. 3A is a top view of an embodiment of a sensing film layer associated with the present apparatus that illustrates the incorporation of pixels in a predetermined pattern.

FIG. 4A is a top view of an embodiment of a power grid sheet associated with the present apparatus that illustrates longitudinal and latitudinal wires as well as conductive rings.

FIG. 4B is a top view of an embodiment of an array of interconnected power grid sheets thereby illustrating a power grid.

DETAILED DESCRIPTION

The present apparatus and method for use will now be described more fully hereinafter with reference to the accompanying drawings, in which embodiments of the apparatus are shown. This apparatus may, however, be embodied in many different forms and should not be construed as limited to the embodiments set forth herein; rather, these embodiments are provided so that this disclosure will be thorough and complete and will fully convey the scope of the method to those skilled in the art. Like numbers refer to like elements throughout.

Figure 1:
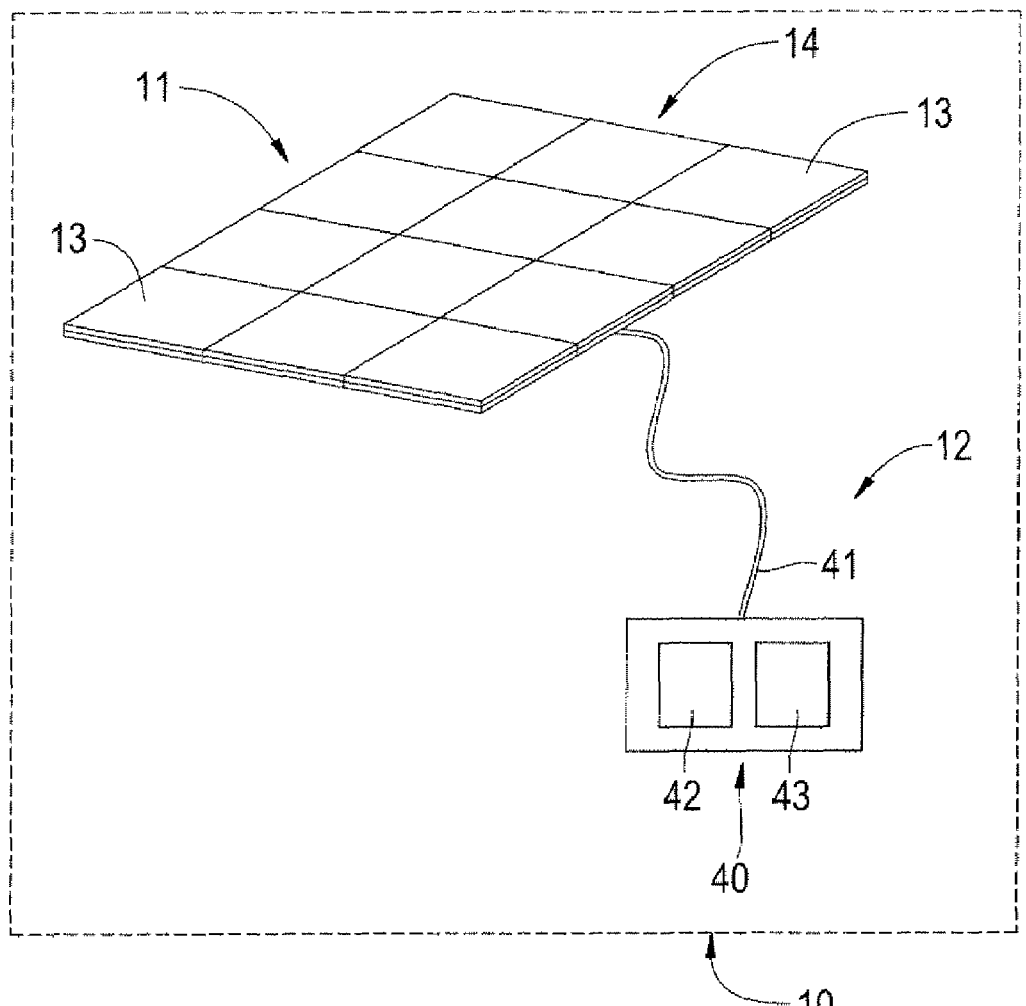
FIG. 1 is a perspective view of an embodiment of the present apparatus, which includes an array as well as a communications and control subsystem.
Figure 2:
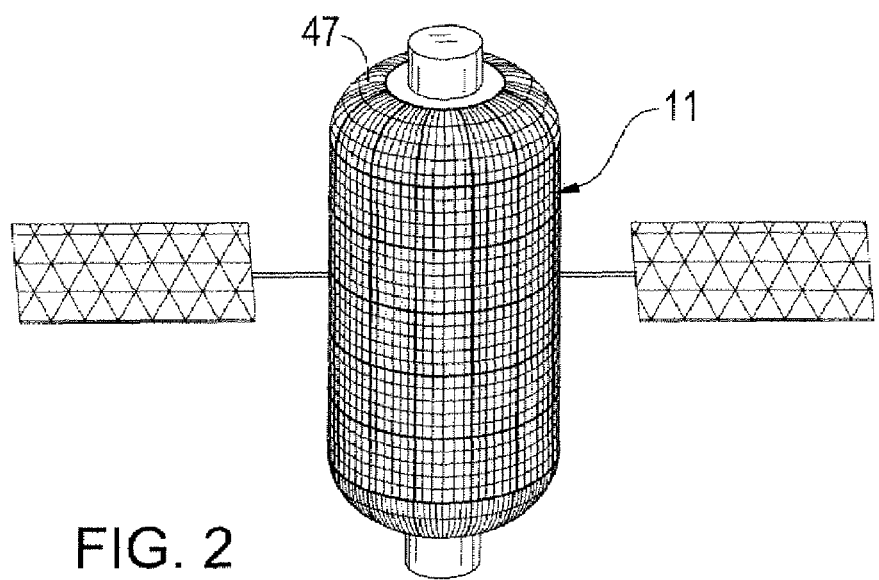
FIG. 2 is a perspective view of an embodiment of the present apparatus applied to a spacecraft.

Referring to the drawings, particularly FIGS. 1 and 2, there is shown an embodiment of an impact detection system 10 of predetermined physical configuration. In a specific embodiment, the impact detection system 10 is capable of determining the time and location of a projectile's impact. In another embodiment, the impact detection system is capable of determining the time and location of a projectile's impact as well as the direction from whence the projectile came. In still another embodiment, the impact detection system 10 is comprised of a cover 11 and a communications and control subsystem 12.

Cover

With continued reference to FIG. 1, in an embodiment, the cover 11 is formed into a rectangular shape and is comprised of at least one panel 13. Preferably, the cover 11 is comprised of a plurality of panels 13 formed in an array 14, wherein each panel 13 is capable of sensing a physical impact on the cover 11 by a projectile, such as the projectile 44 illustrated in FIG. 5. A projectile 44 can include a variety of potential items, such as for example: random debris, hail, military projectiles, burglary tools, vehicles, or micrometeoroids. In another embodiment, the cover 11 is comprised of at least one panel 13 and a self-sealing section 58. The cover 11 is preferably used in combination with a predefined object 47 (e.g., a vehicle, building, wall, etc.) wherein the cover 11 is placed in proximate relationship with the predefined object 47. Multiple embodiments are available in regards to placing the cover 11 in proximate relationship with the predefined object 47. The cover 11 may or may not be firmly adhered to the predefined object 47. In one such embodiment, the cover 11 is uniformly adhered to the surface of the object 47. In another embodiment, the cover 11 is attached to the object 47, but in a non-uniform manner. In still another embodiment, the cover 11 is enclosed in a fabric material wherein the fabric material is attached to the object 47. Further, the shape of the cover 11 may be designed based on a specific application and is thus, not limited to a rectangular shape.

Panel

Figure 3B:
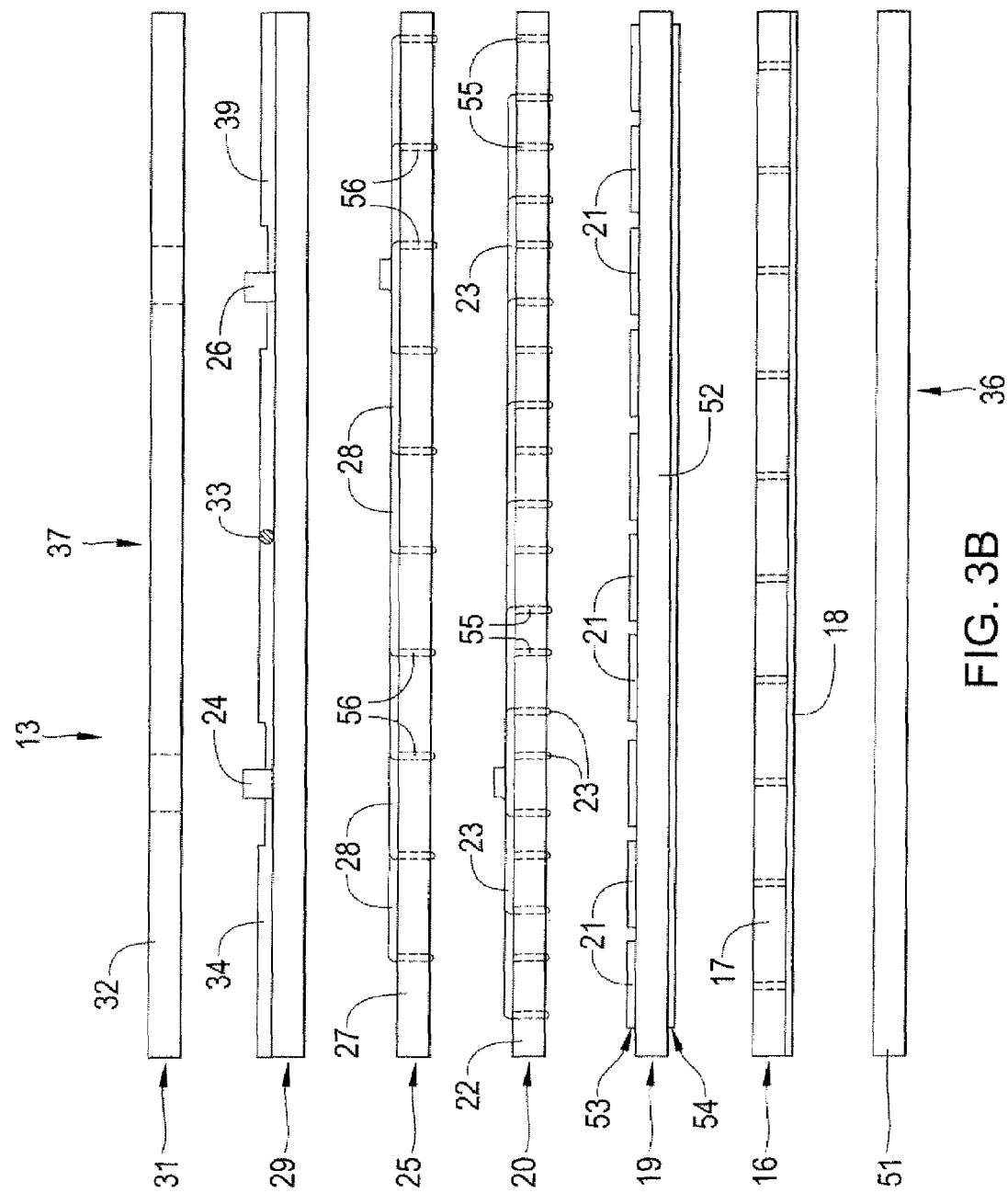
FIG. 3B is an exploded side view of an embodiment of a panel, associated with the present apparatus, that illustrates a plurality of panel layers.

As stated supra, the cover 11 may be comprised of at least one panel 13 and preferably, a plurality of panels 13 formed in an array. The cover 11 may also be comprised of a plurality of panel layers or array layers, which will be described in more detail, infra. Each panel 13 is designed in accordance with a particular application and therefore, its dimensions are scaleable depending on the specific requirements for a particular application. Further, each panel's shape is also designed in accordance with a particular application. With specific reference to FIG. 3B, in an embodiment, each panel 13 is comprised of a plurality of layers. Stated otherwise, each panel 13 is a thin film sandwich of a plurality of layers. As illustrated in FIG. 3B, in an embodiment, a panel 13 is comprised of seven panel layers. However, panel designs that utilize less than seven layers are possible. The particular embodiment illustrated in FIG. 3B will now be described in more detail.

The first panel layer that will be discussed is a backplane 16. A purpose of the backplane 16 is to serve as a continuous conductive layer that may also operate as a structural support for the backside of the cover 11. In an embodiment, the backplane 16 may be comprised of a first support sheet 17 formed of a polymer material and a silk screen layer 18 formed of silver ink silk screened on one side thereby forming the continuous conductive layer. In a particular embodiment the polymer material is a polyimide. The use of a polymer material serves multiple purposes. As an example, one purpose is that the polymer material serves as an insulator, due to the use of multiple layers. As an example, a second purpose is that the polymer material provides additional mechanical strength for the second panel layer, discussed below. Thus, in an embodiment, upon a puncture of a pressurized object resulting in a leak of pressurized air, the self-sealing material would provide a means for attempting to seal the leak.

The second panel layer 19 that will be discussed represents a sensing film. In an embodiment, the second panel layer (also referred to as a sensing film) may be comprised of a thin film piezoelectric material. In a particular embodiment, the thin film piezoelectric material is a PolyVinylidene Fluoride (PVDF) film. Further, the second panel layer 19 is in proximate, operable, and stacked relationship with the backplane 16. In an embodiment, the sensing film 19 is comprised of a thin film piezoelectric material 52 sandwiched in between two conductive layers 53, 54. In the same embodiment, one of the sensing film's 19 conductive layers is scribed into a predetermined number of pixels 21 to enhance spatial resolution. For example, one surface of the sensing film 19 is scribed to create an array of pixels, wherein each pixel 21 may be monitored independently relative to each other. In a specific embodiment, the pixels 21 are incorporated into one side of the sensing film 19 and in particular, into one of the two conductive layers via a process of silk screening, baking, or both. The size, number, and configuration of pixels are predetermined, typically based on the intended application. Through the use of pixels, the sensing film 19 is capable of generating an electric potential signal at the time and location of a projectile's impact and a plurality of related electrical signals due to the projectile's impact. An electrical signal generated by a specific pixel indicates that said pixel has been subjected to a mechanical force. PVDF may be formed as a ferroelectric polymer, exhibiting efficient piezoelectric properties. The relationship between the backplane 16 and the sensing film 19 is such that if the one or both of the sensing film's conductive layers is/are damaged, particularly along a scribe line, the backplane 16 may serve as a continuous conductive layer to ensure the sensing film 19 remains operable. Further, in an embodiment, the panel 13 is not firmly adhered to a mechanical support, such as a plate. It is worth noting that related art designs require the use of tightly securing piezoelectric material to a rigid support structure, because related art designs use only voltage output as a means for processing impact information. Thus, when a piezoelectric material is not secured to a rigid structure in such a related art design, an impact would create a riot of signals in relation to neighboring pixels that effectively makes any measured voltage differential ambiguous to the point of uselessness. As will be discussed infra, the present apparatus and method of use provides a means to determine the location of a projectile's strike on the panel even if the panel is not firmly secured to a surface.

The third panel layer 20 that will be discussed represents a first conductive circuit sheet. In an embodiment, the third panel layer (also referred to as a first conductive circuit sheet) may be comprised of a second support sheet 22 formed of a polymer material and a first plurality of conductive traces 23 attached to said second support sheet 22, wherein said first plurality of conductive traces 23 are routed from one side of said second support sheet 22 to its other side through a first plurality of vias 55. In this embodiment, the sensing film 19 is sandwiched between and in proximate, stacked, and operable relationship with the first conductive circuit sheet 20 and the backplane 16. The use of the backplane 16 and the first conductive circuit sheet 20 also serves as a means for encapsulating the sensing film 19 to prevent shredding of the sensing film 19 upon a projectile's impact. In an embodiment the second support sheet 22 is formed of a polyimide material. As stated above, the first plurality of conductive traces 23 is routed through a first plurality of vias 55, thereby providing a means for operably connecting each pixel 21 to a unique conductive trace associated with the first plurality of conductive traces 23. Stated otherwise, the first plurality of conductive traces 23 provide a means for electrical connectivity for each and every pixel 21. Further, each pixel 21 is thereby interrelated to each other thereby allowing time discrimination between impact signals. Time discrimination will be discussed in more detail, infra. In an embodiment the first plurality of conductive traces 23 may be comprised of electrodes.

The fourth panel layer 25 that will be discussed represents a second conductive circuit sheet. A purpose of the fourth panel layer 25 is to serve as a redundant layer to the third panel layer 20. In an embodiment, the fourth panel layer 25 (also referred to as a second conductive circuit sheet) may be comprised of a third support sheet 27 and a second plurality of conductive traces 28 operably connected to said first plurality of conductive traces 23 and therefore operably connected to each pixel 21. The second plurality of conductive traces 28 is routed from one side of said third support sheet 27 to the other side through a second plurality of vias 56.

With specific reference to FIGS. 4A and 4B as well as FIG. 3B, the fifth panel layer 29 that will be discussed is a power grid sheet. A purpose of the fifth panel layer 29 (also referred to as a power grid sheet) is to provide a means for interconnecting multiple panels in an array as well as a means to supply power to at least one electronics package incorporated in each panel, which is discussed in more detail infra. The power grid sheet 29 may be comprised of a fourth support sheet 50 formed of a polymer material, a plurality of wires attached to said fourth polymer sheet 50, and at least one electronics package 24,26 operably attached to said plurality of wires and attached to said fourth support sheet 50. In a particular embodiment, there is a first wire 33 that runs latitudinally across the power grid sheet 29 and a second wire 34 that runs longitudinally across the power grid sheet 29. The first wire 33 and second wire 34 are operably connected to a first electronics package 24. There may also be a third wire 38 that runs latitudinally across the power grid sheet 29 and a fourth wire 39 that runs longitudinally across the power grid sheet 29. The third wire 38 and fourth wire 39 are operably connected to a second electronics package 26. The fourth support sheet 50 provides the necessary bonding areas for the first and second electronic packages 24, 26. The use of two electronics packages may be duplicative with respect to each other for redundancy purposes. For example, if a projectile strikes one of the electronics packages and either partially or completely disables it, the other electronics package is still available. The use of more than two electronics packages is also possible. A purpose of an electronics package is to monitor the pixels and aid in the detection and location of an impact by sensing a change in electric potential which is generated by the second panel layer 19 and in particular, the piezoelectric material. In addition, an electronics package loads signal information into registers. In a particular embodiment, the first and second electronics packages 24,26 aid in the detection of impact signals, determine the pixel locations of the signals, determine the pixel location of a first signal, and store these pixel locations in a register. The first and second electronics packages 24,26 may be formed of at least an integrated circuit and a communication processor. The integrated circuit may be comprised of a field programmable gate array or an application-specific integrated circuit. Further, the integrated circuit may be radiation-hardened, such as, for use in exoatmospheric space applications. In a particular embodiment, the communication processor is a Motorola® 68HC11 or an 87C51. By incorporating an electronics package in a panel (i.e., a self-contained panel), it becomes possible to "daisy-chain" a plurality of panels together thereby providing a means for covering a wide range of shapes and sizes associated with a particular area. An electronics package may further comprise a signal conditioning device, which may be comprised of signal filters, instrument amplifiers, sample-and-hold amplifiers, isolation amplifiers, signal isolators, multiplexers, bridge conditioners, analog-to-digital converters, digital-to-analog converters, frequency converters or translators, voltage converters or inverters, frequency-to-voltage converters, voltage-to-frequency converters, current-to-voltage converters, current loop converters, charge converters, or any combination. It will be discussed in more detail, infra, in regards to how the plurality of wires is used to form a power grid 35 when the panels 13 are configured into the array 14. In addition, the fifth panel layer 29 may be further comprised of a first conductive ring 30 operatively connected to the first electronics package 24, the first wire 33, and third wire 38. An functionally equivalent second conductive ring 57 may be utilized and operably connected to the second electronics package, the second wire 38, and the fourth wire 39.

The sixth and seventh panel layers 31, 51 represent two insulation sheets formed of a polymer material sandwiching the first through fifth panel layers. For the purposes of this discussion, the sixth and seventh panel layers 31, 51 (also referred to as insulation sheets) are considered the "top" 37 and "bottom" 36 of the panel 13, respectively. Purposes of the sixth and seventh panel layers 31, 51 include the insulation of the overall panel as well as insulation of the panel's circuitry from the outside environment.

Array

With particular attention to FIG. 1, in an embodiment, the cover 11 is assembled by operably connecting a plurality of panels 13 together to form the array 14. Due to the self-contained design of each individual panel 13, an array 14 can be assembled to form a cover 11 that can be customized to fit any desired area (e.g., size and shape). Each panel will operably connect to another panel at a variety of potential locations. For example, a first panel may connect to a second panel at the left, right, top, or bottom side of said first panel, due to the availability of a conductor at all sides of the first panel. Operably connecting panels together may include establishing electrical connections between the various wires for each panel. In particular, when electrical connections between the various wires for each panel are established between two or more panels, one or more power grid 35 results. In the event of an impact that cuts a wire in a particular panel, or even multiple wires in multiple panels, an established power grid provides alternative paths for power, signals, or both to travel to all the panels in an array.

Self-Sealing Section

Figure 7:
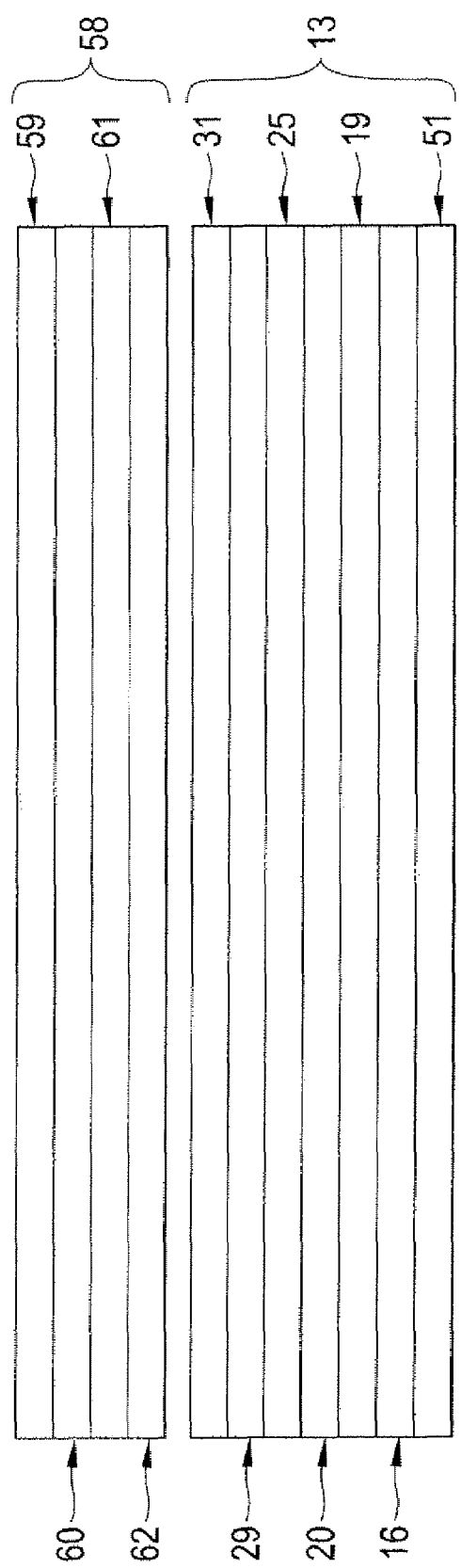
FIG. 7 is a side view of an embodiment of a self-sealing layer in proximate-spaced relationship with an embodiment of a panel.

With particular attention to FIG. 7, as previously stated, in an embodiment, the cover 11 is comprised of at least one panel 13 and a self-sealing section 58, wherein the at least one panel and self-sealing are in proximate-spaced relation in regards to each other. The combination of a panel and a self-sealing section provides a means for detecting the location of impact damage as well as partially or fully sealing a leak resulting from the impact damage. As an example, in certain applications, such a combination improves the overall survivability of a vehicle (such as a spacecraft) that is subjected to damage to a pressure layer or pressure shell by a projectile (such as a micrometeoroid or orbiting debris). Such a combination may also have applications in terrestrial uses. For example, storage tanks or transmission pipes that are subjected to impact damage may require a system to detect and locate leaks as well as stop or slow the leak. The self-sealing section 58 is designed in accordance with a particular application and therefore, its dimensions are scaleable depending on the specific requirements for a particular application. Further, the self sealing section's shape is also designed in accordance with a particular application. With specific reference to FIG. 7, in an embodiment, the self-sealing section 58 is comprised of a plurality of layers. As illustrated in FIG. 7, in an embodiment, the self-sealing section 58 is comprised of four layers. However, self-sealing section designs that utilize more than or less than four layers are possible. The particular embodiment illustrated in FIG. 7 will now be described in more detail.

The first self-sealing section layer that will be discussed is a first sealing film 59. In a preferred embodiment, the first sealing film 59 is formed of a thermoplastic ionomer film. Thermoplastic ionomer is a long-chain polymer material, with ionic centers (i.e., positive and negative charged ions) in the polymer chain which tend to form ionic bonds. This type of material tends to reform these ionic bonds if the bonds are broken. Ionomer plastics have the capacity to self-seal a hole left by high-velocity projectiles. The passage of a high-velocity projectile locally heats the thermoplastic ionomer, which as the thermoplastic initially flows; then draws together due to the natural attraction of the ionic centers within the material to reform in the track of the high-velocity projectile to partially or fully reseal the damage.

The second self-sealing section layer 60 that will be discussed is a toughening layer. In an embodiment, the toughening layer is formed of a high-strength material such as, for example, Kevlar® or a polybenzoxazole (PBO) fabric.

The third self-sealing section layer is a second sealing film 61. The second sealing film 61 is functionally equivalent to the first sealing film 59. A purpose of the second sealing film 61 is to provide redundant functionality in comparison to the first sealing film 59.

The fourth self-sealing section layer is a protective layer 62.

Communications and Control Subsystem

In an embodiment, a communications and control subsystem is comprised of a central electronics unit (CEU) 40 and "a means for operably connecting the CEU to the array" 41. Any means for operably connecting the CEU to the array or panel that is commonly known in the art may be employed. As an example, the use of conductive wires is a means for operably connecting the CEU to the array.

Figure 6:
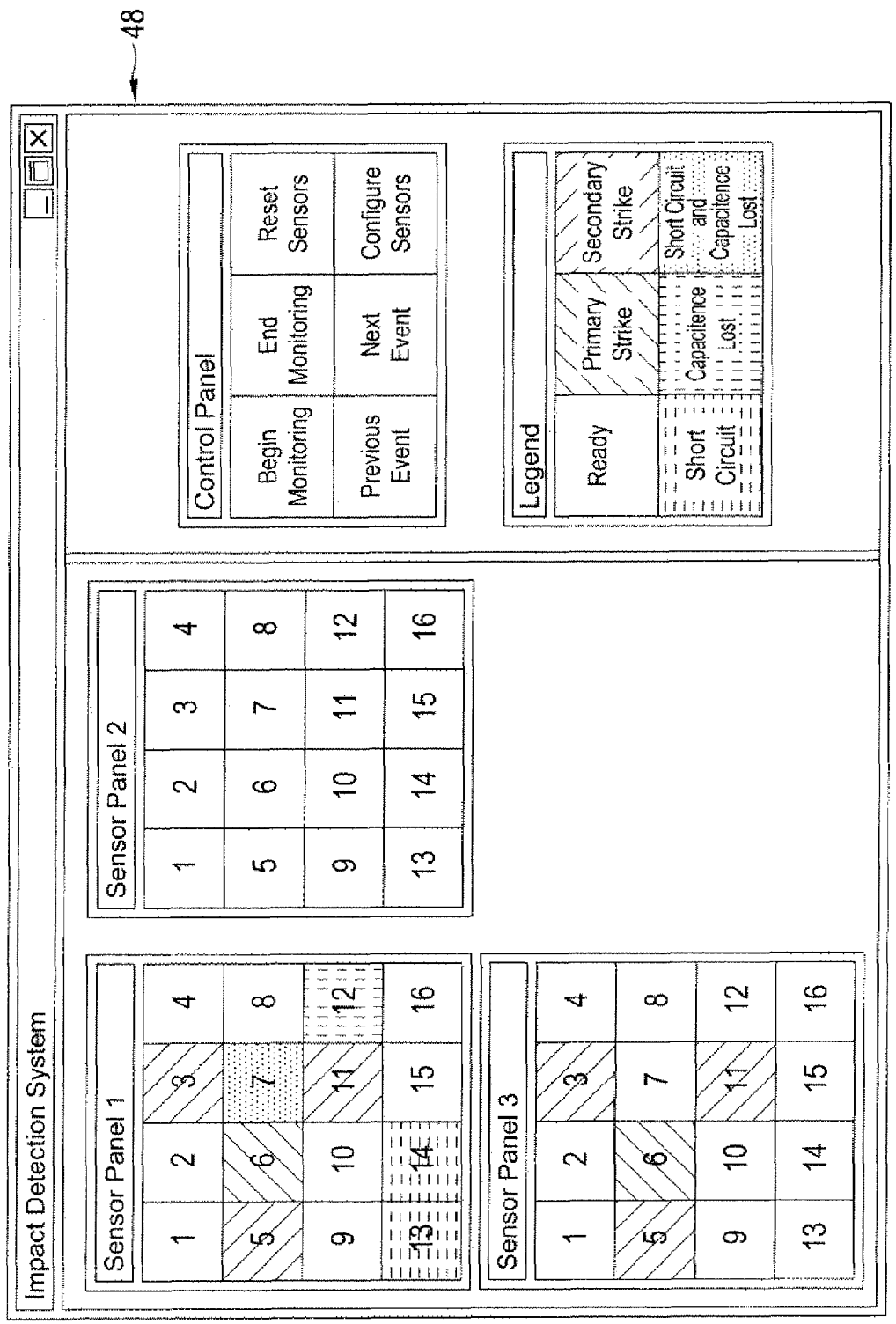
FIG. 6 is a view of a user interface display that electronically displays an impact.

The CEU 40 may be comprised of a computer 42 and an electronics assembly 43. The purpose of the CEU may include: (1) providing an interface to the power grid 35; (2) providing power to the electronics packages 24,26 in the array 14 via a power supply operably connected to the power grid 35; (3) communicating with the electronics packages 24,26; (4) processing the raw data generated from the array 14; and (5) displaying raw data, processed data, or both to a user of the impact detection system 10. An embodiment of a graphical user interface is illustrated in FIG. 6. The computer 42 represents a standard computer commonly known in the art and may comprise a microprocessor, input/output peripherals, memory devices, inherent components (e.g., power units, network devices, etc.), or any combination. In an embodiment wherein the input/output peripherals include a display 43, the display 43 presents impact information to a user. A purpose of the electronics assembly 43 is to control the power grid 35. Another purpose of the electronics assembly 43 is to communicate with the electronics packages in each panel 13. A further purpose of the electronics assembly 43 is to display data to a user. The computer 42 controls the electronics assembly 43 through a predetermined set of control variables. Control variables may include the capability to: (1) activate one power grid or another; (2) apply a predetermined level of voltage to an active power grid; (3) reverse an applied voltage to the active power grid; (4) determine the speed at which the reversed voltage occurs; and (5) send and receive communication messages with the electronics packages in the panels.

Figure 5:
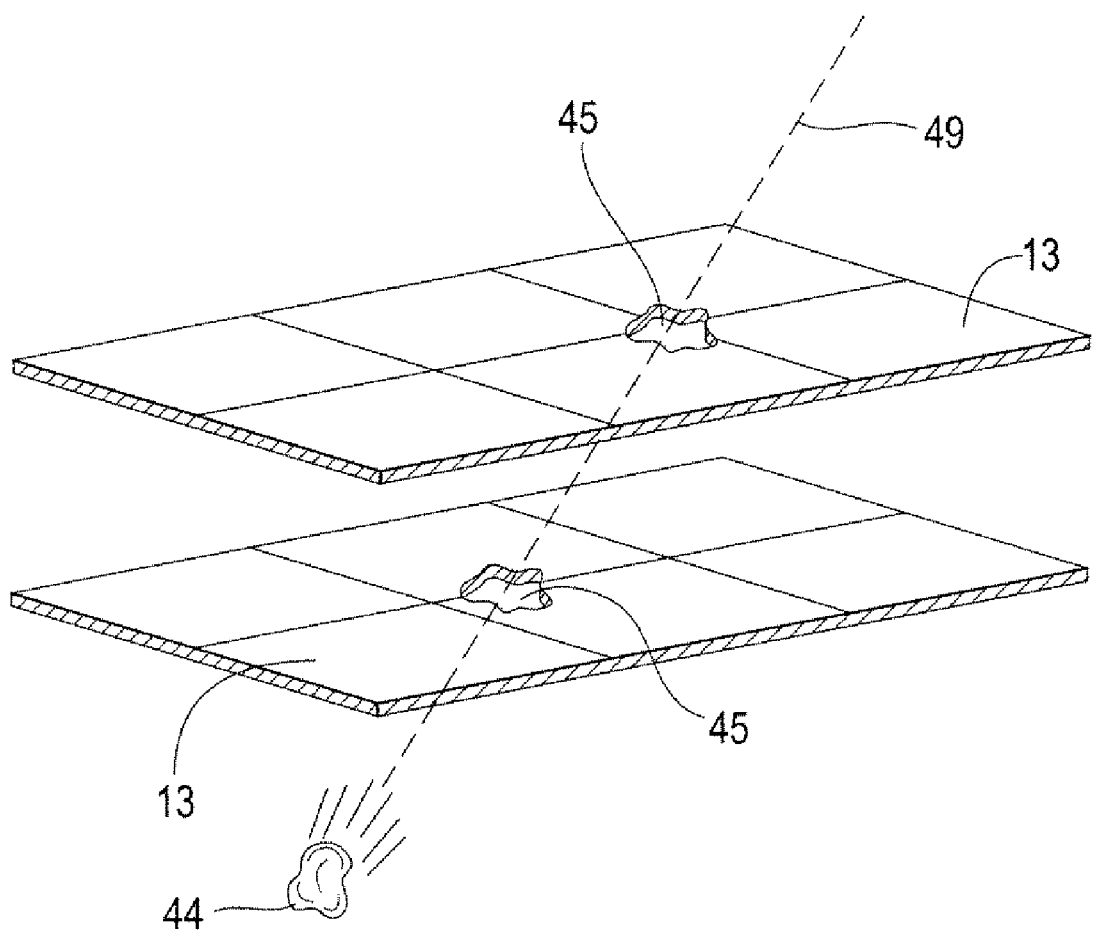
FIG. 5 is a perspective view of an embodiment of a cover incorporating a plurality of sensing film layers to determine the direction of a projectile's impact on the cover.

In other embodiments of the present apparatus as is illustrated in FIG. 5, two or more layers of panels or array of panels in a proximate, stacked relationship to each other may be utilized. A purpose of utilizing two or more layers of panels or array of panels may be to provide a capability to detect impact direction or stated otherwise, the direction from whence the projectile came. Upon a projectile's impact, the location of the projectile's impact on a particular pixel associated with the sensing film of each panel or array of panels may be determined. Based on the location of the projectile's impact and the known space relationship of each of the two or more layers of panels or array of panels and associated pixels, a directional vector is computed using known vector computational techniques. Thus, a determination of the direction from whence a projectile 44 came is performed. Using additional information such as: the relative location of the panel at the time of impact, information related to topography or terrain (both urban and natural), etc., one can calculate the origin of the projectile 44 at least on a rough-order-of-magnitude basis. Predetermined countermeasures could subsequently be deployed based on knowledge in regards to the origin of a projectile 44. Such a configuration could have applications on, for example, military vehicles or on spacecrafts.

Method for Use

Multiple methods exist for the various embodiment described supra. The method described below utilizes multiple variables such as for example: (1) voltage changes, (2) capacitance loss, (3) "short-circuit" information associated with individual pixels in individual panels, (4) time discrimination between the first-to-arrive signals and remaining signals, or (5) any combination. Stated otherwise, the method described below utilizes a voltage analysis, capacitance analysis, short-circuit analysis, time-discrimination analysis, or any combination. A comparative analysis using the results of said capacitance analysis, short circuit analysis, voltage analysis, or any combination and said time discrimination analysis may be utilized to determine the location of said projectile's impact on said cover with greater accuracy. With particular reference to FIG. 8, an embodiment of a method of use will now be described. The order of the aforementioned steps are for example purposes only and are not intended to limit the sequence of steps or the combination of steps in any way.

Stage 1—Normal Operations

The CEU 40 outputs a first predetermined level of voltage (e.g., 5V) onto the power grid. The first predetermined level of voltage powers the electronics packages 24,26 in the panels. In an embodiment, power is less than 10 W.

Stage 2—Impact

A projectile 44 strikes the array 14 and creates a gap 45 in the array 14. The resulting mechanical stress created by the projectile's 44 impact on the impacted panel 13 or more specifically, the panels' second panel layer's 19 piezoelectric material will result in an electrical voltage emitted by the piezoelectric material. The use of two electronics packages 24,26 and the plurality of wires in each panel 13 provides the capability to create two redundant power grids. The redundant power grids provide multiple alternative paths for power, signals, or both to travel to all panels in the array 14. Stated otherwise, the redundancy in the multiple power grids mitigates the potential for the gap 45 to cause a short in the interconnectivity of the panels. Upon the projectile's 44 impact, a tone is generated by the affected panel or panels' active electronics package(s) as a result of the impact whereby the tone is conducted onto an active power grid. The CEU 40 generates a responding tone Stage 3—Communications Mode The tone is detected by the CEU 40, whereby the CEU 40 processes the tone and recognizes that the affected panel or panels is/are calling for attention. The CEU 40 subsequently increases the active power grid voltage to a second predetermined level. This increase turns off the tone and turns on a predefined and stored communications logic in all panels.

Stage 4—Initial Que

Once the communications logic is activated, the CEU 40 transmits a first broadcast message to all panels in the array 14 that all affected panel or panels should report back to the CEU 40.

Stage 5—Initial Response

Any affected panel which has recorded an impact will attempt to communicate first predefined information to the CEU 40. But before an impacted panel transmit its first predefined information, the affected panel checks to see if the active power grid is busy with messages from any other panel. If the active power grid is busy, the affected panel will wait for a predefined time period (e.g., 50 msecs) and then check again. This routine is repeated until the active power grid is available. When the active power grid is available, the affected panel will perform a first transmission of its identification (ID) number to the CEU 40. There may be more than one affected panel, but eventually all affected panels will communicate its first transmission of its ID number to the CEU 40 and the active power grid will go back into a quiescent mode.

Stage 6—Initial Confirmation

The CEU 40 will then perform a first return transmission to the array 14 comprising a first ID list of the affected panels that it received. Each affected panel will listen for its ID and if it is listed properly in the first ID list, it will remain quiet. If it is not on the first ID list, the relevant affected panel will perform a second transmission of its ID. Since there is a possibility that more than one panel is responding with a second transmission of its ID, the same arbitration scheme as described in Stage 5 is used. If a panel "squawks" that it has been missed, the CEU's 40 computer will perform a second return transmission back to the array of a second ID list of the affected panels that it received.

Stage 7—Pixel Inquiry

The CEU 40 transmits a first predefined message to each affected panel wherein the first predefined message is comprised of requesting a response for each pixel that generated a voltage change.

Stage 8—Pixel Response

Each affected panel will reply with a first transmission of voltage information in regards to which pixel(s) generated a voltage change. The steps in Stages 7 and 8 will be repeated for each affected panel that was in the first or second ID list. In the event that a complete reply is not received, the entire process in Stages 2 through 7 for an affected panel will be repeated a predetermined number of times.

Stage 9—Time Discrimination Analysis

In the course of impact testing, it was unexpectedly determined that when a panel is not firmly adhered to a suitably stiff mounting structure (e.g., glued to a metal plate), multiple pixels respond to an impact. In some test cases, all pixels responded, thereby creating complete ambiguity in regards to determining the location of the impact. Unless a panel is firmly adhered and the impact is relatively light, there will be too many signals to determine where the impact occurred based on related art technologies.

It was further unexpectedly determined that measuring the amplitude of the signals doesn't solve the problem because the pixel that is impacted doesn't necessarily produce the strongest signal. Test results showed that in many cases, the neighboring pixels became flexed and produce a stronger signal as compared to the actual pixel that was impacted. This result was not anticipated. For example, if a projectile does not puncture a piezo-electric material (but rather "bends" the material), the portion of the piezo-electric material that is bent can have a higher signal as opposed to a portion that is punctured. After analysis and discussions, it was postulated that the reason for this unpredictable result is because if piezo-electric material is removed (from a puncture) it cannot produce a signal.

As a practical matter, it was determined that simple detection of a signal, without more, can generally lead to ambiguous results, because there are too many signals resulting from an impact. Further, simple measurement of signal characteristics (e.g., amplitude) is also problematic, as described above.

However, it was determined that a time discrimination analysis does result in a means for determining the location of an impact. The time discrimination analysis may be automated via computer software. When an impact occurs, a shock wave will travel across a panel at the speed of sound consistent with the material used (i.e., sonic velocity of the material). The shock wave is similar to a stone's ripple in a pond. The shock wave travels much slower than the electrical pulse caused by an impact. As the shock wave travels outward, many pixels are activated, but it is the first impacted pixel that is of primary interest. In other words, the first impacted pixel will produce a signal a fraction of an instant before any neighboring pixels will produce resultant signals associated with a projectile's impact, wherein the neighboring proximate pixels produce its related signals before any distal pixels.

In an embodiment, the time discrimination analysis is performed based on a first-to-arrive (FTA) basis or more specifically, by monitoring, marking, recording, and comparing a plurality of received electrical potential signals and determining the order of the signals based on relative time, absolute time, or both.

In an embodiment, the FTA basis may be implemented by utilizing two registers, which can be incorporated in the CEU 40. In such an embodiment, the two registers may be characterized as a Main Register and a FTA Register. Each register may be comprised of flip-flops, which may serve as memory elements. There may be at least one flip-flop per pixel, although one flip-flop per pixel is the preferred embodiment. In preparation for an impact, all flip-flops in both registers are in a low state.

When an impact occurs, and signals greater than a predetermined threshold value may be received by the CEU 40 from a plurality of pixels, wherein said signals may be stored first in the Main Register. The nature of the flip-flops is that said flip-flops can be set high at any time until "readout" occurs. After an impact, a readout sequence may occur that essentially reads the Main Register to determine if any flip-flops have been set. After said readout, the Main Register's flip-flops may be reset to a low state.

The FTA Register can follow the Main Register. The FTA Register has a memory element for each pixel, and each flip-flop input may be related to the associated Main Register flip-flop output. For example, for pixel #5 there is an associated Main Register flip-flop #5. The Main Register flip-flop #5's output can subsequently drive the FTA Register's flip-flop #5. In this example, there is a difference in the clock lines between the Main Register and the FTA Register, because in the FTA Register only one flip-flop will be set for each impact or "event." The Main Register's flip-flops respond to each pixel that produces a signal. Conversely, in this example, the FTA Register's flip-flops are only allowed to set as long as a predetermined "HIT line" is set to "low." The HIT line is the logical OR of all the flip-flops in the Main Register. Since these flip-flops are initially low, the HIT line will also be low. When a pixel generates a signal, the associated Main Register's flip-flop is set, and the HIT line is set to "high" and stays "high" until there is a readout. The effect is that the first flip-flop to transition in the Main Register will cause the associated flip-flop in the FTA Register to also set. Subsequently, the HIT line is set to high and no other FTA flip-flops can be set, even if signals ultimately arrive for all of them. Reading the FTA Register then reveals which flip-flop was the one to set. This flip-flop is thus, the flip-flop that is associated with the impacted pixel.

In a second embodiment, multiple FTA and Main Registers are utilized. Multiple registers may be used if there are multiple layers of panels or arrays. In this particular embodiment, each panel layer or "plane" has its own FTA and Main Register. Thus, the flip-flop associated with the impacted pixel for each sensing film incorporated in each panel may be determined and consequently, a directional vector for the projectile can also be determined.

Stage 10—Capacitance Analysis

The CEU 40 can create a pulse or specifically, reverse the polarity of the active power grid from the first predetermined level of voltage to a second predetermined level of voltage and then reverses the polarity again to the same first predetermined level of voltage (e.g., from +10V to −10V and back to +10V). For pixels that are in good health and have the proper predetermined capacitance, the pulse will be more than sufficient to trip its associated flip-flop. If the pixel has been damaged, there will be less capacitance left between the pixel and the flip-flop and the flip-flop will not set. The effect, then, is to set the flip-flops of all pixels that have the correct capacitance on them, and not to set the flip-flops of the pixels that have been damaged. Laboratory testing has shown that a pixel that suffers a severe capacitance loss is generally the center of an impact.

The CEU 40 can perform a first capacitance query by transmitting a second broadcast message that queries all panels in an array 14 to provide second predefined information with their IDs if a panel has any pixels that are not set.

Each panel that has any pixels that are not set responds with its second predefined information in the same manner as in Stage 5. A panel that responds will communicate its second predefined information which is comprised of its ID to the CEU 40. The CEU 40 will process a third ID list.

The CEU 40 sends out the third ID list that it processed as a result of the second predefined information it received based on the first capacitance query. Each panel, that has any pixels that are not set, will listen for its ID and if it is listed properly in the third ID list, it will remain quiet. If it is not on the third ID list, the relevant panel will respond with its ID again in the manner described in Stage 6.

The CEU 40 may perform a second capacitance query by transmitting a second predefined message to each panel asking it to respond with the pixels that were not set.

Each addressed panel replies with information about which pixels were not set or "tripped." Additional capacitance query and associated responses are repeated for each panel that responded in the first capacitance query. Further, error checking is performed in the same manner as described in Stage 8.

Stage 11—Short Circuit Analysis

The CEU 40 can slowly reverse the polarity of the active power grid to a predetermined voltage level (e.g., −10V), and then slowly reverse the polarity again (e.g., +10V). For pixels that are shorted to the backplane 16, this will trip its associated flip-flop. The capacitance is not a factor, because the voltage changes relatively slow. Slow in this case is, for example, about a hundred microseconds. The effect is to set the flip-flops of all pixels that are shorted. Laboratory testing has shown that a pixel that is shorted is usually close to the center of an impact.

It should be noted that at no time does the backplane 16 itself have any voltage on it with respect to a vehicle to which the cover 11 is mounted. The relative voltages are achieved by manipulating the voltage on the active power grid such as, for example, by inverting +10V to −10V.

The CEU 40 may perform a first short-circuit query by transmitting a third broadcast message that queries the panels to respond with third predefined information comprised of IDs, if a panel has a flip-flop that is set.

Each panel, responding with the third predefined information to the first short-circuit query, responds in the same manner as described in Stage 5. An affected panel communicates the third predefined information comprised of its ID to the CEU 40.

The CEU 40 sends out a fourth ID list, as a result of the first short-circuit query. Every panel, as a result of the short-circuit query, listens to the CEU's broadcast of the fourth ID list and if appropriate, retransmits in the same manner as described in Stage 6.

The CEU 40 may perform a second short-circuit query by transmitting a fourth broadcast message to each panel on the fourth ID list asking each of these panels to respond with the flip flops that were set.

Each of the panels on the fourth ID list replies with fourth predefined information comprising information related to which flip flops were set. Additional short-circuit queries and associated responses may be repeated for each panel on the fourth ID list. Error checking is performed in the same manner as in Stage 8.

Stage 12—Return to Normal Operational Mode

To return to a normal operational mode, the CEU 40 can reduce the voltage on the active power grid (e.g., to 5V). This reduction in voltage effectively turns off all the communication processors and returns overall power to a few milliwatts per panel.

Stage 13—Filtering

The CEU 40 maintains a log of the previously shorted and damaged pixels. The CEU 40 filters all new data by removing any pixels that were previously archived as having discrepancies.

Stage 14—Weighing

The CEU 40 has a table describing which pixels generated a signal, which pixels have no capacitance due to an impact, and which pixels are shorted. These pixels are then assigned different colors for display purposes: e.g., pixels that responded would be labeled in orange; pixels that are shorted would be labeled as yellow; and pixels that have inadequate capacitance are labeled as red.

Stage 15—Display

The CEU 40 displays the pixel map on an appropriate display such as, for example, a LCD display associated with a laptop computer. Such a display, in color, makes the center of an impact relatively clear.

Stage 16—Update

The CEU 40 updates an archive with new information about which pixels are now shorted and which pixels are damaged.

Stage 17—Return

The CEU 40 returns to Stage 1.

If any panel is so damaged that it immediately regenerates the impact tone after returning to Stage 1, the CEU 40 will communicated with that panel to disable the offending pixel. In the event that the panel cannot be quieted, CEU 40 will generate a command to turn the specific panel off. In the event that the specific panel will not turn off (e.g., not respond to commands) the CEU 40 sends a command to all the other panels to use an alternative frequency and ignores the original frequency. Finally, in the case of extreme problems with the active power grid (e.g., a power grid short to ground), the active power grid will be switched off to become the passive power grid and the passive power grid will be made the active power grid.

Periodically, the CEU 40 will put all circuitry in a communications mode and communicate with each panel to obtain a health and status report. The CEU 40 will then switch from the current active power grid to the current passive power grid and repeat the process.

Having described the present apparatus and methods for use above, various modifications of the techniques, procedures, materials, and equipment will be apparent to those skilled in the art. It is intended that all such variations within the scope and spirit of the apparatus and methods for use are included within the scope of the appended claims.

What is claimed is:

1. A method for detecting a projectile impacting a cover comprising the steps of:

providing said cover comprised of a plurality of panel layers, each panel layer in proximate and stacked relationship to each other, wherein each panel layer is comprised of a plurality of panels, wherein each panel is comprised of:
a sensing film comprised of a piezoelectric material;
scribed into a predetermined number of pixels of predetermined shape and size; and capable of generating a electric potential signal upon said projectile's impact on said cover and a plurality of related electrical signals due to said projectile's impact;
a first conductive circuit sheet in proximate, operable, stacked relationship with said sensing film, wherein said first conductive circuit sheet is comprised of a first support sheet and a plurality of electrodes attached to said first support sheet and operably connected to said predetermined number of pixels; and
a power grid sheet in proximate and stacked relationship with said first conductive circuit sheet, wherein said power grid sheet is comprised of a second support sheet, at least one electronics package attached to said power grid sheet, and at least one wire operably connected attached to said power grid sheet, wherein at least one of at least one wire is operably connected to said at least one electronics package;
providing a communications and control subsystem operably connected to at least one of said at least one wire;
upon impact of said projectile on said cover, performing a time discrimination analysis between said electric potential signal and said related electric potential signals for each of said panel layers to determine said projectile's impact's location on each panel layer, wherein said time discrimination analysis is performed by said communications and control subsystem;
determining the direction from whence said projectile came by analyzing said projectile's impact's location on each panel layer, wherein said step of determining said direction is performed by said communications and control subsystem; and
displaying, recording, or both said direction and said location on said communications and control subsystem.

2. An apparatus comprising:
a cover comprised of:
 a backplane comprised of a first support sheet and a continuous conductive plane attached to said first support sheet;
 a sensing film wherein said sensing film is in proximate, stacked, and contact relationship with said backplane, wherein said sensing film is scribed on one side in a predetermined number of pixels, wherein said sensing film is capable of generating an electric potential signal at the time and location of said projectile's impact and a plurality of related electrical signals due to said projectile's impact;
 a first conductive circuit sheet in proximate, stacked, and contact relationship with said sensing film, wherein said at least one sensing film is sandwiched between said first conductive circuit sheet and said backplane, wherein said first conductive circuit sheet is comprised of:
  a first support sheet; and
  a first plurality of conductive traces attached to said first support sheet and operably connected to each of said predetermined number of pixels;
 a second conductive circuit sheet in proximate, stacked, and contact relationship to said first conductive circuit sheet, wherein said second conductive circuit sheet is comprised of:
  a second support sheet; and
  a second plurality of conductive traces attached to said second support sheet and operably connected to said first plurality of conductive traces;
 a power grid sheet in proximate, contact relationship with said second conductive circuit sheet, wherein said power grid sheet is comprised of a fourth support sheet, at least one electronics package attached to said fourth support sheet, and at least one wire connected to said fourth support sheet, wherein at least one of said at least one wire is operably connected to said at least one electronics package and is capable of operable connection with an external element; and
 an insulation sheet in proximate and stacked relationship with said power grid sheet; and
a communications and control subsystem operably connected to said cover wherein the communications and control subsystem is comprised of a general purpose data processor and a means of performing a time discrimination analysis between said electric potential signal and said related electric potential signals to determine the time and location of said electric potential signal.

* * * * *